(12) United States Patent
Arnaud

(10) Patent No.: US 12,230,628 B2
(45) Date of Patent: Feb. 18, 2025

(54) SWITCHING DEVICE AND METHOD OF MANUFACTURING SUCH A DEVICE

(71) Applicant: STMICROELECTRONICS (TOURS) SAS, Tours (FR)

(72) Inventor: Aurelie Arnaud, Saint-Cyr-sur-Loire (FR)

(73) Assignee: STMICROELECTRONICS (TOURS) SAS, Tours (FR)

( * ) Notice: Subject to any disclaimer, the term of this patent is extended or adjusted under 35 U.S.C. 154(b) by 235 days.

(21) Appl. No.: 18/053,722

(22) Filed: Nov. 8, 2022

(65) Prior Publication Data

US 2023/0089468 A1    Mar. 23, 2023

Related U.S. Application Data

(62) Division of application No. 16/709,753, filed on Dec. 10, 2019, now Pat. No. 11,532,616.

(30) Foreign Application Priority Data

Dec. 11, 2018    (FR) ...................................... 1872694

(51) Int. Cl.
*H01L 27/07*    (2006.01)
*H01L 27/02*    (2006.01)
*H01L 21/265*    (2006.01)
*H01L 21/266*    (2006.01)

(52) U.S. Cl.
CPC ...... *H01L 27/0783* (2013.01); *H01L 27/0248* (2013.01); *H01L 21/26513* (2013.01); *H01L 21/266* (2013.01)

(58) Field of Classification Search
None
See application file for complete search history.

(56) References Cited

U.S. PATENT DOCUMENTS

| | | |
|---|---|---|
| 2009/0079022 A1 | 3/2009 | Keena et al. |
| 2012/0025351 A1 | 2/2012 | Komatsu |
| 2015/0002967 A1 | 1/2015 | Kawase et al. |
| 2015/0221628 A1 | 8/2015 | Arnaud |
| 2016/0211254 A1* | 7/2016 | Kang .................. H01L 29/0847 |
| 2017/0077082 A1 | 3/2017 | Marreiro et al. |
| 2017/0200785 A1* | 7/2017 | Janssens ............. H01L 27/0629 |
| 2019/0043856 A1* | 2/2019 | Agam ................. H01L 29/0653 |

FOREIGN PATENT DOCUMENTS

| | | |
|---|---|---|
| CN | 1355934 A | 6/2002 |
| CN | 106233439 A | 12/2016 |
| DE | 19614876 C1 | 11/1997 |
| JP | 2001135719 A | 5/2001 |

* cited by examiner

*Primary Examiner* — Steven M Christopher
(74) *Attorney, Agent, or Firm* — Seed IP Law Group LLP

(57) ABSTRACT

The present disclosure concerns a switching device comprising a first phosphorus-doped silicon layer on top of and in contact with a second arsenic-doped silicon layer. The present disclosure also concerns a method of making a switching device that includes forming a phosphorus-doped silicon layer in an arsenic-doped silicon layer.

19 Claims, 3 Drawing Sheets

SWITCHING DEVICE AND METHOD OF MANUFACTURING SUCH A DEVICE

BACKGROUND

Technical Field

The present disclosure generally concerns electronic circuits and, more particularly, switching devices. The present disclosure particularly concerns switching devices capable of being used as devices of protection against electrostatic discharges or ESDs.

Description of the Related Art

Switching devices adapted to a use as a device of protection against electrostatic discharges capable of occurring between two terminals of an electronic circuit are known. Such a device is intended to be connected between the two terminals of the circuit, and is configured to turn on when an electrostatic discharge occurs between the two terminals. Such a turning-on of the device enables to protect the circuit against electrostatic discharges.

Known switching devices suffer from various disadvantages, particularly when they are used as a device of protection against electrostatic discharges.

BRIEF SUMMARY

At least one embodiment of the present disclose is a switching device overcoming at least certain disadvantages of known switching devices.

At least one embodiment of the present disclose is a switching device capable of being used as a device of protection against electrostatic discharges, overcoming at least certain disadvantages of known devices of protection against electrostatic discharges.

Thus, an embodiment provides a switching device comprising a first phosphorus-doped silicon layer on top of and in contact with a second arsenic-doped silicon layer.

According to an embodiment, the doping level of the first layer decreases as the distance to the second layer increases.

According to an embodiment, the device comprises a stack successively comprising, in contact two by two, a third P-type doped silicon layer, the second layer, the first layer, and a fourth N-type doped silicon layer.

According to an embodiment, at the interface between the first and fourth layers, the doping level of the first layer is equal to the doping level of the fourth layer.

According to an embodiment, the device comprises a first P-type doped region arranged in the fourth layer, on the side opposite to the first layer.

According to an embodiment, the third layer is connected to a first terminal of the device and the first region is connected to a second terminal of the device.

According to an embodiment, the device further comprises a second P-type doped region arranged in the fourth layer, on the side opposite to the first layer, and a third N-type doped region arranged in the second region, on the side opposite to the first layer.

According to an embodiment, the second and third regions are connected to the first terminal of the device.

According to an embodiment, the first and second terminals of the device are intended to be connected to two respective terminals of a circuit to be protected against an electrostatic discharge.

According to an embodiment, the device comprises an epitaxial silicon layer on top of and in contact with a silicon substrate, the second layer being located in the substrate and the first layer extending from the second layer into the epitaxial silicon layer, the thickness of the epitaxial layer being preferably in the range from 10 to 14 µm.

According to an embodiment, the third layer is located in the substrate, the fourth layer being located in the epitaxial silicon layer.

Another embodiment provides a method of manufacturing a switching device comprising the steps of: a) forming an arsenic-doped silicon layer; and b) forming a phosphorus doped silicon layer in the arsenic-doped silicon layer.

According to an embodiment, step a) comprises implanting arsenic atoms into a P-type doped silicon substrate to form the arsenic-doped silicon layer, step b) comprising implanting phosphorus atoms into the arsenic doped silicon layer to form the phosphorus-doped silicon layer.

According to an embodiment, the method further comprises, after steps a) and b), a step of growing, by epitaxy from the substrate, an N-type doped silicon layer.

According to an embodiment, step a) comprises the deposition of a mask on the substrate, the implantations of steps a) and b) being performed by using the mask.

BRIEF DESCRIPTION OF THE SEVERAL VIEWS OF THE DRAWINGS

The foregoing and other features and advantages will be discussed in detail in the following non-limiting description of specific embodiments in connection with the accompanying drawings.

DETAILED DESCRIPTION

Figure 1:
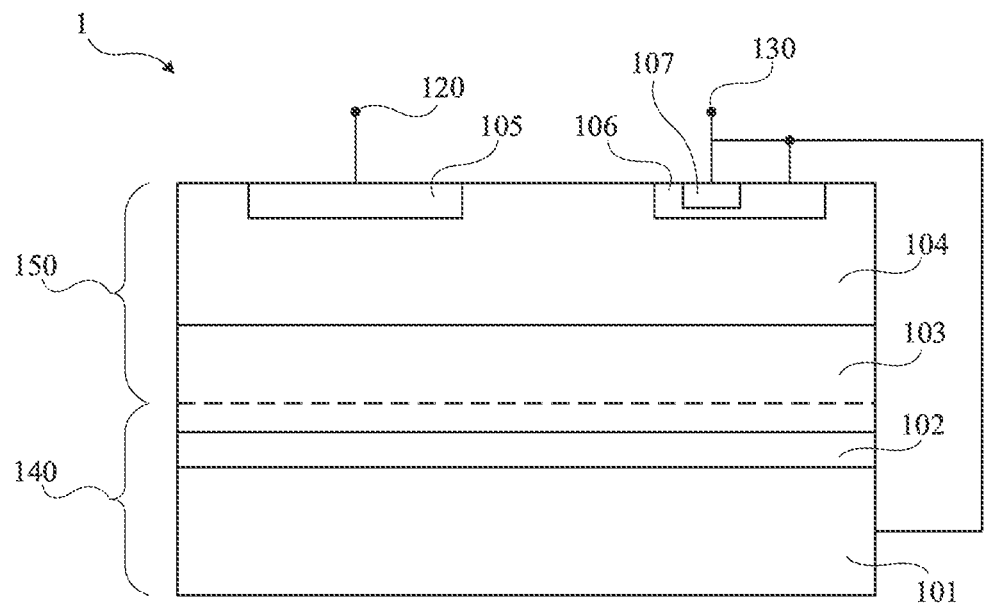
FIG. 1 very schematically shows, in cross section view, an embodiment of a switching device.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the various electronic circuits to be protected against electrostatic discharges have not been described, the described embodiments being compatible with usual electronic circuits to be protected against electrostatic discharges.

Throughout the present disclosure, the term "connected" is used to designate a direct electrical connection between circuit elements with no intermediate elements other than conductors, whereas the term "coupled" is used to designate an electrical connection between circuit elements that may be direct, or that may be via one or more intermediate elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "approximately", "substantially", and "in the order of" are used herein to designate a tolerance of plus or minus 10%, preferably of plus or minus 5%, of the value in question.

FIG. 1 very schematically shows in cross-section view an embodiment of a switching device 1. In particular, device 1 is adapted to a use as a device of protection against electrostatic discharges, for example, electrostatic discharges defined by standard IEC 6100, part 4-2, or by one of the models among the HBM (Human Body Model), the MM (Machine Model), and the CDM (Charge Device Model).

Device 1 comprises a stack of doped semiconductor layers, such as doped silicon layers. The stack successively comprises, from bottom to top in FIG. 1, a layer 101 of P-type doped silicon, a layer 102 of arsenic-doped silicon, a layer 103 of phosphorus-doped silicon, and a layer 104 of N-type doped silicon, the layers being in contact two by two. The doping level of layer 102 is higher than that of layer 104, the doping level of layer 103 being between the doping level of layer 102 and that of layer 104. Further, the doping level of layer 103 decreases as the distance from layer 102 increases. Preferably, the doping level of layer 103 decreases from a maximum value corresponding to the doping level of layer 102 at the limit, or interface, between layers 102 and 103. Preferably, the doping level of layer 103 decreases towards layer 104 so that, at the interface between layers 103 and 104, the doping level of layer 103 is substantially equal, preferably equal, to that of layer 104. In other words, the interface between layers 103 and 104 for example corresponds to the passing from a region (layer 103) with a doping level which decreases as the distance to layer 102 increases, to a region (layer 104) with a substantially constant doping level, preferably constant.

Device 1 further comprises, on the left-hand side of FIG. 1, a P-type doped region 105. Region 105 extends in layer 104 from the upper surface thereof, across a portion only of the thickness of layer 104. In other words, region 105 is arranged in layer 104, on the side opposite to layer 103.

Region 105 is coupled, preferably connected, to a terminal 120 of device 1. Layer 101 is coupled, preferably connected, to a terminal 130 of device 1. When the device is used to protect an electronic circuit against electrostatic discharges, for example, an electronic circuit belonging to the same integrated circuit chip as device 1, terminals 120 and 130 are intended to be coupled, preferably connected, to two respective terminals of the circuits between which an electrostatic discharge is likely to occur. Preferably, terminal 130 of device 1 is intended to be coupled, preferably connected, to a terminal of the circuit coupled to ground.

In this embodiment, device 1 further comprises, on the right-hand side of FIG. 1, a P-type doped region 106. Region 106 penetrates into layer 104 from the upper surface thereof, across a portion only of the thickness of layer 104. In other words, region 106 is arranged in layer 104, on the side opposite to layer 103. The device also comprises an N-type doped region 107. Region 107 penetrates into region 106 from the upper surface thereof, that is, the upper surface of layer 104, across a portion only of the thickness of region 106. In other words, region 107 is arranged in region 106, on the side opposite to layer 103. Regions 106 and 107 are coupled, preferably connected, to terminal 130 of device 1.

In this embodiment, the stack of layers 101, 102, 103, 104, and 105 is located, that is, formed, in an assembly comprising a silicon substrate 140 and an epitaxial silicon layer 150 resting on top of and in contact with substrate 140, the interface between substrate 140 and layer 150 being materialized by dotted lines in FIG. 1. As shown in FIG. 1, layers 101 and 102 are located in substrate 140, layer 104 being located in layer 150. Further, layer 103 is formed in layer 102, on the side of layer 140, and propagates in layer 104. It is thus located astride substrate 140 and layer 150.

Figure 2:
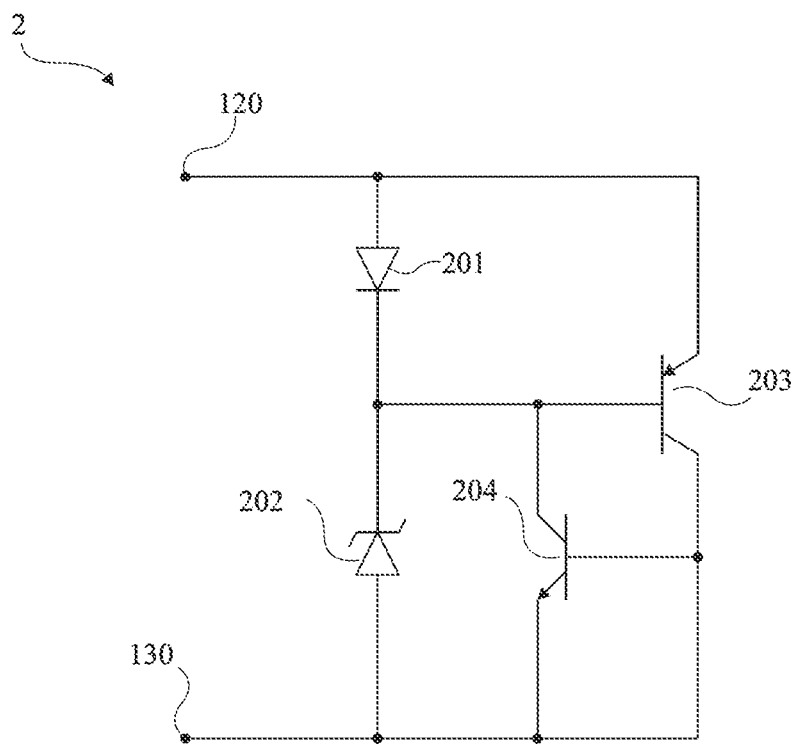
FIG. 2 schematically shows a circuit equivalent to the switching device of FIG. 1.

FIG. 2 schematically shows a circuit 2 equivalent to the switching device of FIG. 1. In circuit 2, the intrinsic resistors and/or capacitors of device 1 have not been shown.

Circuit 2 comprises two diodes 201 and 202 series connected between terminals 120 and 130. The anode of diode 201 corresponds to region 105 of device 1 of FIG. 1 and is coupled, preferably connected, to terminal 120, the cathode of diode 201 corresponding to layer 104 of device 1. The anode of diode 202 corresponds to layer 101 of device 1 and is coupled, preferably connected, to terminal 130, the cathode of diode 202 corresponding to layer 102 of device 1. The cathodes of diodes 201 and 202 are coupled to each other via layer 103. Preferably, diode 202 is a transient voltage suppression diode, or TSV diode, also designated with trademark Transil.

In this example where the device comprises regions 106 and 107, circuit 2 further comprises two bipolar transistors 203 and 204.

Transistor 203 is a PNP-type bipolar transistor having its base, collector, and emitter regions respectively corresponding to N-type doped layer 104, to P-type doped region 106, and to P-type doped region 105. Thus, the emitter of transistor 203 is coupled, preferably connected, to terminal 120, the collector of transistor 203 being coupled, preferably connected, to terminal 130. Further, the base of transistor 203 is coupled to the cathodes of diodes 201 and 202 via layer 104.

Transistor 204 is an NPN-type bipolar transistor having its base, collector, and emitter regions respectively corresponding to P-type doped region 106, to N-type doped layer 104, and to N-type doped region 107. Thus, the emitter of transistor 204 is coupled, preferably connected, to terminal 130, the collector of transistor 204 being coupled to the cathodes of diodes 201 and 202 and to the base of transistor 203 via layer 104. Further, the base of transistor 204 is coupled to the collector of transistor 203 via region 106.

Transistors 203 and 204 of device 1 form a thyristor or SCR (Silicon Controlled Rectifier) having its anode coupled, preferably connected, to terminal 120 and having its cathode coupled, preferably connected, to terminal 130, the thyristor gate corresponding to P-type doped region 106 and being coupled, preferably connected, to terminal 130 of device 1.

Figure 3A:
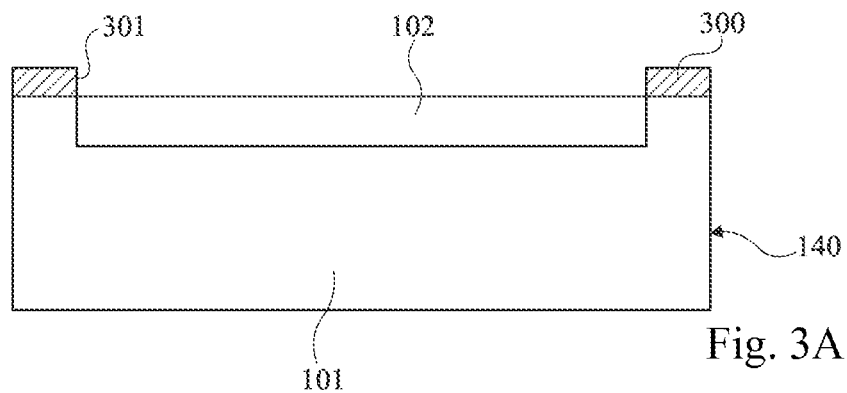
FIGS. 3A-3C illustrate successive steps of an embodiment of a method of manufacturing a switching device of the type in FIG. 1.
Figure 3B:
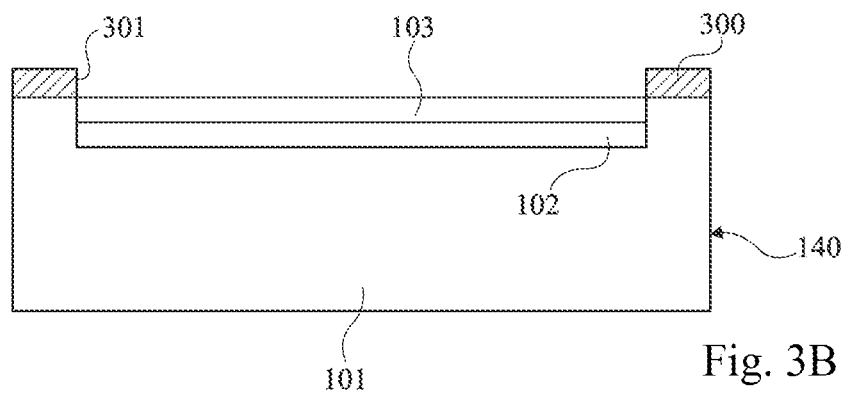
Figure 3C:
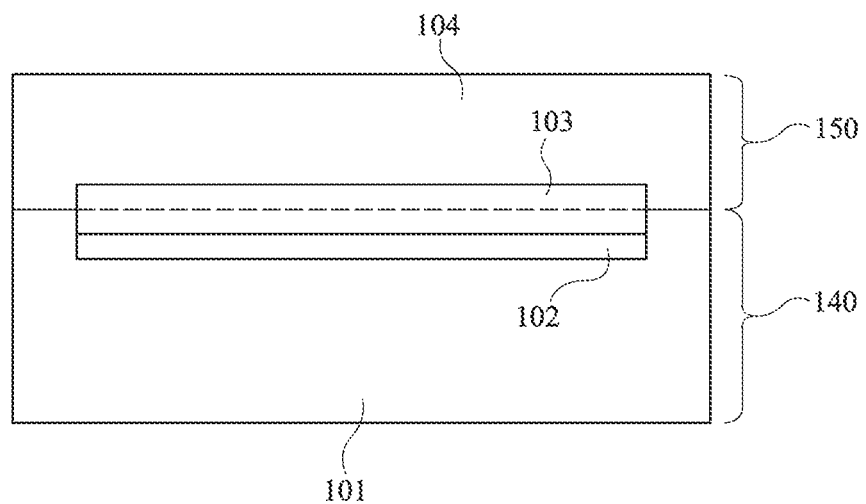

FIGS. 3A-3C show successive steps of an embodiment of a method of manufacturing a switching device of the type of that in FIG. 1.

in FIG. 3A, a P-type doped silicon substrate 140, for example, boron-doped, is provided. Substrate 140 for example corresponds to a silicon wafer. Layer 102 is formed in substrate 140 by doping of the substrate with an arsenic implantation. The portion of substrate 140 located under layer 102 then corresponds to layer 101 described in relation with FIG. 1.

In this embodiment, prior to the arsenic implantation, a mask 300 is deposited on the upper surface of substrate 140. The mask comprises an opening 301 at each location of substrate 140 where a device 1 is desired to be formed, the arsenic implantation only occurring at the level of each opening 301.

In FIG. 3B, layer 103 is formed in substrate 140, and more particularly in layer 102, by doping of the substrate by phosphorus implantation. Layer 103 is formed across a portion only of the thickness of layer 102. Layer 103 is formed on the upper surface side of layer 102, that is, on the upper surface side of substrate 140. Preferably, the phosphorus is implanted with a dose smaller than that of arsenic, so that the doping level of layer 103 is smaller than that of layer 102. Preferably, the phosphorus is implanted with an implantation power smaller than that of arsenic so that layer 103 penetrates less deeply into substrate 140 than layer 102. Thus, the avalanche voltage of diode 202 is determined by the doping levels of layer 102 and of substrate 140, that is, of layer 101.

In this embodiment, mask 300 is used again on implantation of the phosphorus, the phosphorus implantation thus only occurring at the level of each opening 301 of mask 300.

In FIG. 3C, mask 300 is removed, after which a silicon layer 150 is formed by epitaxy from substrate 140. Silicon layer 150 is N-type doped, with a doping level smaller than that of layer 103 at the previous step. Preferably, epitaxial silicon layer 150 is doped in situ, that is, during the epitaxial growth of silicon, with a doping level corresponding to that of layer 104.

As shown in FIG. 3C, due to the fact that the doping level of epitaxial silicon 150 is lower than that of layer 103 formed in FIG. 3B, the phosphorus atoms of layer 103 diffuse into epitaxial silicon 150. As a result, layer 103 penetrates into layer 150, and the doping level in layer 103 decreases as the distance to layer 102 increases. Above layer 103, the portion of layer 150 into which layer 103 does not penetrate corresponds to layer 104 described in relation with FIG. 1. It will be noted that no heat treatment step is specifically provided for the phosphorus atoms to diffuse into the epitaxial silicon 150, the phosphorus atoms diffusing into the epitaxial silicon 150 during the epitaxy and during potential subsequent heat treatment steps.

At next steps, not illustrated, region 105 and, in this example, regions 106 and 107 are formed during doping steps, usual per se.

In the above-described method, due to the fact that the same mask 300 is used for the implantation of arsenic and for the implantation of phosphorus, layer 103 is formed without providing an additional mask with respect to a method of manufacturing a device similar to device 1 but which would have no layer 103.

As a variation, it may be provided for each of layers 102 and 103 to be formed over the entire surface of substrate 140, omitting mask 300. Here against, the above described method comprises no additional mask with respect to a method of manufacturing a device similar to device 1 but which would not have layer 103.

In device 1 of FIG. 1 and the manufacturing method described in relation with FIGS. 3A-3C, advantage is taken from the fact that phosphorus atoms diffuse more than arsenic atoms in silicon. This provides a layer 103 having a doping level which decreases as the distance to layer 102 increases, while keeping a given doping level in layer 102 which sets, with layer of layer 101 (substrate 140), the characteristics of diode 202 (FIG. 2), particularly the avalanche voltage thereof.

Figure 4:
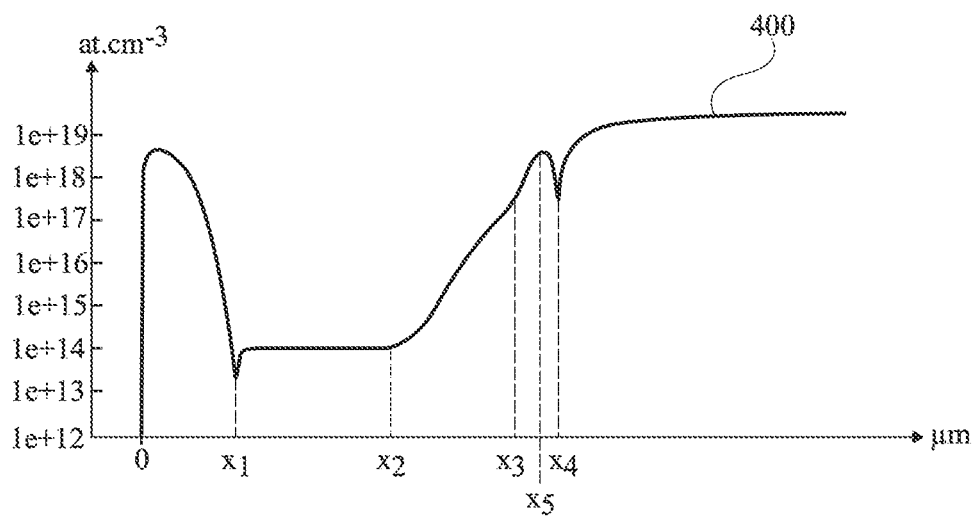
FIG. 4 shows a curve illustrating the variation of the doping level in the device of FIG. 1, along an axis AA of FIG. 1.

FIG. 4 shows a curve 400 illustrating the variation, along an axis AA of FIG. 1, of the doping level according to the depth relative to the upper surface of device 1, the doping level being indicated in ordinates, in dopant atoms per square centimeter (at·cm$^{-3}$) and the depth being indicated in abscissas, in micrometers (µm). Curve 400 here corresponds to a device 1 obtained according to the method described in relation with FIG. 3.

Region 105 extends across the thickness from the upper surface of the device (depth equal to 0 µm), that is, the upper surface of region 105, to a depth x1 of approximately 2.8 µm in this example. In this example, the maximum doping level in region 105 is approximately equal to $5*10^{18}$ at·cm$^{-3}$ and decreases towards the PN junction with layer 104.

Layer 104 extends across the thickness from depth x1 to a depth x2 of approximately 7.2 µm in the present example. In this example, the doping level of layer 204 is approximately equal to $1*10^{14}$ at·cm$^{-3}$.

Layer 103 extends across the thickness from depth x2 to a depth x3 of approximately 10.7 µm in the present example. In this example, at depth x2, the doping level of layer 103 is equal to that of layer 104, the doping level of layer 103 increasing down to depth x3, that is, to layer 102, where it is equal to approximately $3*10^{17}$ at·cm$^{-3}$.

Layer 102 extends across the thickness from depth x3 to a depth x4 of approximately 12 µm in this example. In this example, the doping level of layer 102 is maximum and approximately equal to $5*10^{18}$ at·cm$^{-3}$ at the level of a depth x5 between x3 and x4 and approximately equal to 11.5 µm, the doping level decreasing as the distance to the PN junction with layer 101 increases and as the distance to layer 103 increases.

Layer 101 extends across the thickness from depth x4, the doping level in layer 101 being equal to approximately $2*10^{19}$ at·cm$^{-3}$ in the present example.

Curve 400 illustrates the variation of the doping level for a specific example of device 1, other doping levels and/or thickness of layers or regions being likely to be provided.

As an example, the thicknesses of the different layers and/or regions of device 1 may be:
  in the range from approximately 2 µm to approximately 5 µm, preferably from 2 to 5 µm, for example, equal to approximately 2.5 µm for regions 105 and 106;
  in the range from approximately 0.5 µm to approximately 3 µm, preferably from 0.5 to 3 µm, for example, equal to 1 µm for region 107;
  in the range from approximately 4 µm to approximately 8 µm, preferably from 4 to 8 µm, for example, equal to approximately 5 µm for layer 104;
  in the range from approximately 2 µm to approximately 6 µm, preferably from 2 to 6 µm, for example, equal to 3 µm for layer 103;
  in the range from approximately 1 µm to approximately 2 µm, preferably from 1 to 2 µm, for example, equal to 1.5 µm for layer 102; and
  in the range from approximately 10 µm to approximately 14 µm, preferably from 10 to 14 µm, for example, equal to 11 µm for layer 150.

As an example, particularly in the case where device 1 has the dimensions indicated hereinabove as an example, the doping levels of the different layers and/or regions of device 1 may for example be:
  in the range from approximately $5*10^{17}$ at·cm$^{-3}$ to approximately $1*10^{19}$ at·cm$^{-3}$, preferably from $5*10^{17}$ at·cm$^{-3}$ to $1*10^{19}$ at·cm$^{-3}$, for example approximately equal to $5*10^{18}$ at·cm$^{-3}$ for layer 102;

in the range from approximately $1*10^{13}$ at·cm$^{-3}$ to approximately $1*10^{15}$ at·cm$^{-3}$, preferably from $1*10^{13}$ at·cm$^{-3}$ to $1*10^{15}$ at·cm$^{-3}$, for example approximately equal to $1*10^{14}$ at·cm$^{-3}$ for layer 104;

in the range from approximately $5*10^{17}$ at·cm$^{-3}$ to approximately $1*10^{19}$ at·cm$^{-3}$, preferably from $5*10^{17}$ at·cm$^{-3}$ to $1*10^{19}$ at·cm$^{-3}$, for example approximately equal to $5*10^{18}$ at·cm$^{-3}$ for regions 105 and 106;

in the range from approximately $5*10^{17}$ at·cm$^{-3}$ to approximately $1*10^{19}$ at·cm$^{-3}$, preferably from $5*10^{17}$ at·cm$^{-3}$ to $1*10^{19}$ at·cm$^{-3}$, for example approximately equal to $5*10^{18}$ at·cm$^{-3}$ for region 107; and in the range from approximately $1*10^{18}$ at·cm$^{-3}$ to approximately $1*10^{20}$ at·cm$^{-3}$, preferably from $1*10^{18}$ at·cm$^{-3}$ to $1*10^{20}$ at·cm$^{-3}$, for example approximately equal to $3*10^{19}$ at·cm$^{-3}$ for layer 101.

The operation of device 1 described in relation with FIGS. 1 to 4 is the following.

It is here considered that terminal 130 of the device is coupled to ground. When an electrostatic discharge occurs between terminals 120 and 130, a voltage peak can be observed between terminals 120 and 130. As soon as the voltage between terminals 120 and 130 is greater than the sum of the threshold voltage of diode 201 and the avalanche voltage of diode 202, a current flows from terminal 120 to terminal 130, via diodes 201 and 202, which enables to carry off the electrostatic discharge to ground.

In this example where the device comprises regions 106 and 107, that is, transistors 203 and 204, after diode 202 has started conducting, PNP transistor 203 turns on as soon as the current injected into its base is sufficient. Once on, transistor 203 draws current from the base of NPN transistor 204, which then turns on. This provides an additional conductive path between terminals 120 and 130 to carry off the electrostatic discharge to ground.

In device 1, layer 103 eases the transfer of charge carriers between region 105 and layer 102 during an electrostatic discharge between terminals 120 and 130. This enables to decrease the turn-on time of device 1, and in particular of its diode 202, as compared to that of a similar device comprising no layer 103. Such a faster turning-on enables for the electrostatic discharge to be carried off or absorbed faster, and thus for the voltage peak between terminals 120 and 130 to be lower.

Further, in the absence of layer 103, the dopant atoms of substrate 104 might diffuse all the way into epitaxial silicon layer 150. The corresponding device then would have a stack successively comprising layer 101, layer 102, a P-type doped layer, and layer 104. As compared with device 1, such a device could benefit from a decreased capacitance between terminals 120 and 130. However, due to manufacturing variations, and in particular relative to the doping level of substrate 140, dispersions of the value of such a capacitance would be greater than in the case of device 1.

Figure 5:
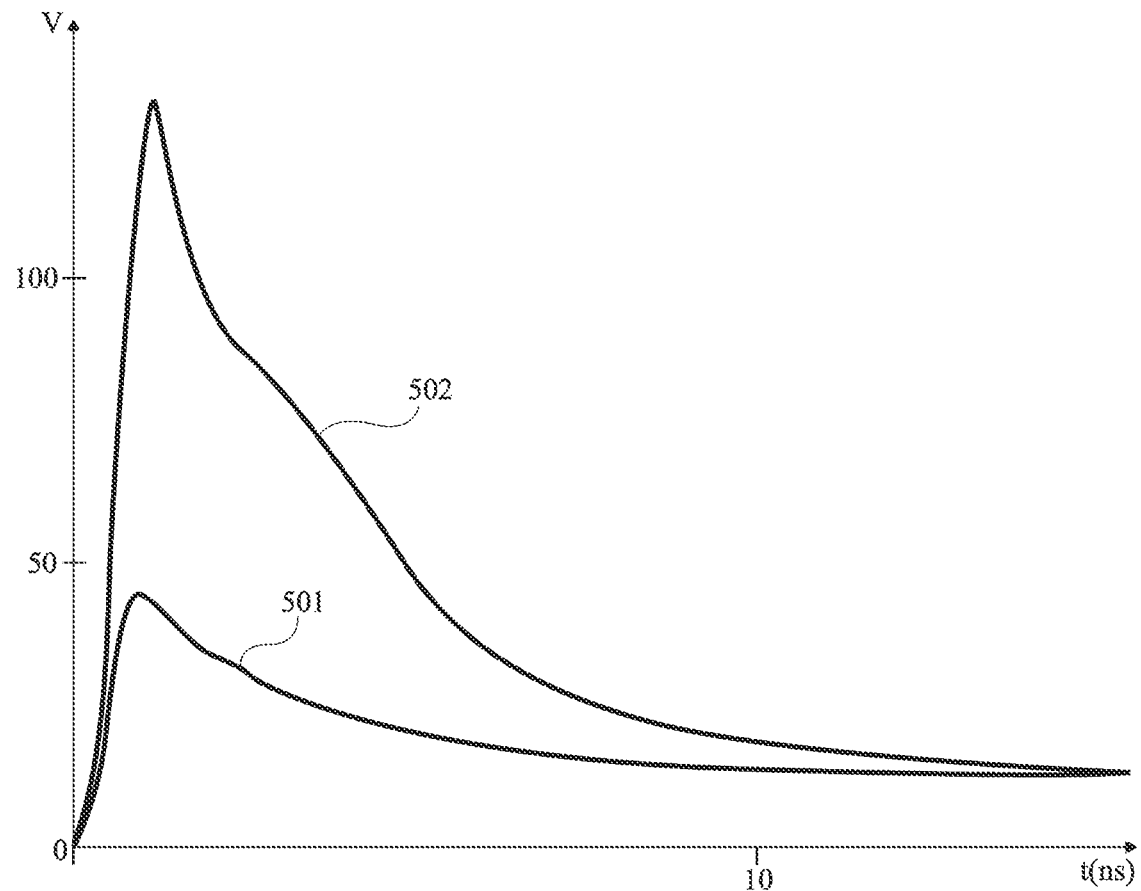
FIG. 5 shows two curves illustrating, during an electrostatic discharge, the time variation of a voltage respectively across the switching device of FIG. 1 and across an example of a switching device.

FIG. 5 shows two curves 501 and 502 illustrating, during an electrostatic discharge, the time variation of the voltage between terminals 120 and 130 respectively of the switching device of FIG. 1 and of a switching device similar to that of FIG. 1 but comprising no layer 103, the voltage being referenced to terminal 130. In this example, curves 501 and 502 are obtained by simulation with an electrostatic discharge of one kilovolt in accordance with IEC standard 6100, part 4-2.

As can be seen in FIG. 5, the voltage peak between terminals 120 and 130 of device 1 (curve 501) is smaller, there, at least twice smaller, than the voltage peak of the device corresponding to curve 502. More particularly, in this example, the voltage peak of curve 501 reaches a maximum value of approximately 45 while the voltage peak of curve 502 reaches a maximum value of approximately 130 V. This results from the fact that device 1 corresponding to curve 501 is turned on faster than the device corresponding to curve 502. An electronic circuit is thus better protected against electrostatic discharges by device 1 than by a similar device comprising no layer 103.

Starting from the device corresponding to curve 502, to decrease the device turn-on time, it could have been devised to decrease the thickness of layer 104, that is, the thickness of epitaxial layer 150 in the present example. However, leakage currents in such a device would have been greater than those of device 1. It could also have been devised to more heavily dope layer 103 with arsenic. However, defects due to the implantation of arsenic atoms would have been more numerous and the PN junction between layers 101 and 102 would have been more abrupt than in device 1, which would have resulted in leakage currents greater than those of device 1.

Various embodiments and variations have been described. It will be understood by those skilled in the art that certain characteristics of these various embodiments and variations may be combined, and other variations will occur to those skilled in the art. In particular, a switching device of the type in FIG. 1 but where regions 106 and 107 are omitted or replaced with other doped semiconductor regions, benefits, like the device of FIG. 1, from the advantages linked to layer 103.

Finally, the practical implementation of the described embodiments and variations is within the abilities of those skilled in the art based on the functional indications given hereinabove.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of manufacturing a switching device, comprising:
    forming an arsenic-doped silicon layer; and
    forming a phosphorus-doped silicon layer in the arsenic-doped silicon layer.

2. The method of claim 1, wherein:
    forming the arsenic-doped silicon layer comprises implanting arsenic atoms into a P-type doped silicon substrate; and
    forming the phosphorus-doped silicon layer includes implanting phosphorus atoms into the arsenic-doped silicon layer.

3. The method of claim 2, comprising, after implanting arsenic atoms into the P-type doped silicon substrate and implanting phosphorus atoms into the arsenic-doped silicon layer, growing, by epitaxy from the substrate, an N-type epitaxial layer.

4. The method of claim 3, wherein growing the N-type epitaxial layer includes increasing the phosphorus-doped silicon layer and forming an N-type doped silicon layer on the phosphorus-doped silicon layer.

5. The method of claim 2, wherein:
forming the arsenic-doped second silicon layer comprises depositing a mask on the substrate;
using the mask while implanting arsenic atoms into the P-type doped silicon substrate and while implanting phosphorus atoms into the arsenic-doped silicon layer.

6. A method, comprising:
forming an arsenic-doped silicon layer on a P-type silicon layer;
forming a phosphorus-doped silicon layer on and in contact with the arsenic-doped silicon layer;
forming an N-type silicon layer on and in contact with the phosphorus-doped silicon layer; and
forming a first P-type region in the N-type silicon layer at a side of the N-type silicon layer opposite to the phosphorus-doped silicon layer, the first P-type region having a P-type material in direct contact with N-type material of the N-type silicon layer.

7. The method of claim 6, comprising forming the arsenic-doped silicon layer is between the P-type silicon layer and the phosphorus-doped silicon layer.

8. The method of claim 7, comprising forming the phosphorus-doped silicon layer is between the arsenic-doped silicon layer and the N-type silicon layer.

9. The method of claim 6, comprising forming the phosphorus-doped silicon layer with a doping level that decreases as a distance to the N-type silicon layer decreases.

10. The method of claim 9, comprising forming, at an interface between the phosphorus-doped silicon layer and the N-type silicon layer, the phosphorus-doped silicon layer with a doping level equal to a doping level of the N-type silicon layer.

11. The method of claim 6, comprising:
forming a first terminal coupled to the P-type silicon layer; and
forming a second terminal coupled to the first P-type region.

12. The method of claim 11, comprising:
forming a second P-type region in the N-type silicon layer at the side of the N-type silicon layer opposite to the phosphorus-doped silicon layer.

13. The method of claim 12, comprising forming an N-type region in the second P-type region at the side of the N-type silicon layer opposite to the phosphorus-doped silicon layer.

14. A method, comprising:
forming a P-type first semiconductor layer;
forming an arsenic-doped second semiconductor layer on the first semiconductor layer;
forming a phosphorus-doped third semiconductor layer on and in contact with the second semiconductor layer;
forming an N-type fourth semiconductor layer on and having N-type material in direct contact with the third semiconductor layer; and
forming a first P-type region embedded in the N-type fourth semiconductor layer at a side of the N-type fourth semiconductor layer opposite to the third semiconductor layer, the first P-type region having a P-type material in direct contact with the N-type material of the N-type fourth semiconductor layer from a vertical direction.

15. The method of claim 14, comprising forming the third semiconductor layer with a doping level that decreases as the distance to the fourth semiconductor layer decreases.

16. The method of claim 14, comprising forming a second P-type region arranged in the fourth semiconductor layer at the side of the fourth semiconductor layer opposite to the third semiconductor layer.

17. The method of claim 16, comprising forming an N-type region in the second P-type region at the side of the fourth semiconductor layer opposite to the third semiconductor layer.

18. The method of claim 17, comprising forming a first diode with the first and second semiconductor layers; and
forming a second diode with the first P-type region and the fourth semiconductor layer.

19. The method of claim 18, comprising forming a PNP bipolar transistor having base, emitter, and collector regions respectively corresponding to the fourth semiconductor layer, first P-type region, and second P-type region; and
forming an NPN bipolar transistor having base, collector, and emitter regions respectively corresponding to the second P-type region, fourth semiconductor layer, and N-type region.

* * * * *